United States Patent
Hesselgren et al.

(10) Patent No.: US 12,209,181 B2
(45) Date of Patent: Jan. 28, 2025

(54) POLYMER COMPOSITION WITH IMPROVED STORAGE STABILITY

(71) Applicant: BOREALIS AG, Vienna (AT)

(72) Inventors: Jessica Hesselgren, Stenungsund (SE); Stefan Hellstrom, Stenungsund (SE); Jeroen Oderkerk, Stenungsund (SE); Francis Costa, Linz (AT); Denis Yalalov, Stenungsund (SE)

(73) Assignee: BOREALIS AG, Vienna (AT)

( * ) Notice: Subject to any disclaimer, the term of this patent is extended or adjusted under 35 U.S.C. 154(b) by 0 days.

(21) Appl. No.: 18/002,071

(22) PCT Filed: Jun. 21, 2021

(86) PCT No.: PCT/EP2021/066819
§ 371 (c)(1),
(2) Date: Dec. 16, 2022

(87) PCT Pub. No.: WO2022/002666
PCT Pub. Date: Jan. 6, 2022

(65) Prior Publication Data
US 2023/0227644 A1 Jul. 20, 2023

(30) Foreign Application Priority Data
Jun. 30, 2020 (EP) .................................... 20183015

(51) Int. Cl.
*B32B 3/04* (2006.01)
*B32B 27/30* (2006.01)
(Continued)

(52) U.S. Cl.
CPC .............. *C08L 51/003* (2013.01); *B32B 3/04* (2013.01); *B32B 27/306* (2013.01); *B32B 27/32* (2013.01);
(Continued)

(58) Field of Classification Search
None
See application file for complete search history.

(56) References Cited

U.S. PATENT DOCUMENTS

| 3,236,917 A | 2/1966 | Giulio et al. |
| 4,639,495 A | 1/1987 | Waggoner |

(Continued)

FOREIGN PATENT DOCUMENTS

| CN | 104736626 A | 6/2015 |
| CN | 106715570 A | 5/2017 |

(Continued)

OTHER PUBLICATIONS

Encyclopedia of Polymer Science and Engineering, vol. 6, 1986, pp. 383-410.
(Continued)

Primary Examiner — Dustin Q Dam
(74) Attorney, Agent, or Firm — Tarolli, Sundheim, Covell & Tummino LLP

(57) ABSTRACT

The present invention relates to a polymer composition (I) comprising at least the following components: (A) 87.00 to 99.79 wt.-% based on the overall weight of the polymer composition (I) of a specific polymer, (B) 0.20 to 10 wt.-% based on the overall weight of the polymer composition (I) of a specific copolymer of ethylene and (C) 0.01 to 3.00 wt.-% based on the overall weight of the polymer composition (I) of a compound according to Formula (a), whereby components (A), (B) and (C) add up to 100 wt.-%. In addition, the present invention refers to a photovoltaic module comprising at least one layer comprising polymer composition (I), to a method for improving the storage stability and/or transport stability of polymer (A) and to the use of components (B) and (C) for improving the storage stability and/or transport stability of a polymer (A).

18 Claims, 2 Drawing Sheets

Figure 1:
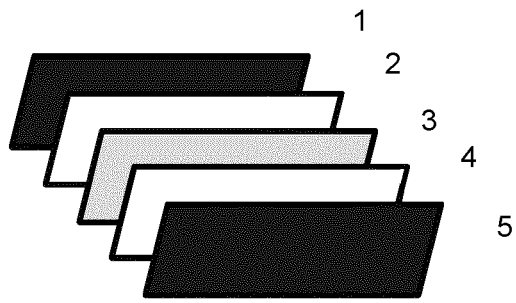

(51) Int. Cl.
  *B32B 27/32* (2006.01)
  *C08K 5/3492* (2006.01)
  *C08L 51/00* (2006.01)
  *H01L 31/048* (2014.01)
  *B32B 17/10* (2006.01)

(52) U.S. Cl.
  CPC ...... *C08K 5/34926* (2013.01); *H01L 31/0481* (2013.01); *B32B 17/10* (2013.01); *B32B 17/10073* (2013.01); *B32B 2457/12* (2013.01); *C08L 2205/025* (2013.01); *C08L 2205/03* (2013.01)

(56) References Cited

U.S. PATENT DOCUMENTS

| | | | |
|---|---|---|---|
| 4,950,541 | A | 8/1990 | Tabor et al. |
| 5,194,509 | A | 3/1993 | Hasenbein et al. |
| 8,981,011 | B2 | 3/2015 | Chae et al. |
| 11,552,210 | B2 | 1/2023 | Hellstrom et al. |
| 2006/0201544 | A1* | 9/2006 | Inoue ........................ C08J 5/18 136/251 |
| 2012/0145236 | A1 | 6/2012 | Fujiki |
| 2015/0325729 | A1 | 11/2015 | Kapur |
| 2020/0098941 | A1* | 3/2020 | Hellstrom ............. C08F 210/02 |
| 2020/0168753 | A1 | 5/2020 | Eo et al. |

FOREIGN PATENT DOCUMENTS

| | | | | |
|---|---|---|---|---|
| CN | 107924960 | A | 4/2018 | |
| CN | 108517188 | A | 9/2018 | |
| CN | 109563301 | A | 4/2019 | |
| CN | 110041834 | A | 7/2019 | |
| CN | 110753724 | A | 2/2020 | |
| EP | 2144301 | A1 | 1/2010 | |
| EP | 2913358 | A1 * | 9/2015 | ................ C08F 8/42 |
| WO | 2017/076629 | A1 | 5/2017 | |
| WO | 2018/011324 | A1 | 1/2018 | |
| WO | 2018/141672 | A1 | 8/2018 | |
| WO | WO-2018229191 | A1 * | 12/2018 | ............ C08F 210/02 |
| WO | 2019/134904 | A1 | 7/2019 | |
| WO | 2019/158520 | A1 | 8/2019 | |
| WO | 2019/201646 | A1 | 10/2019 | |
| WO | 2019/201934 | A1 | 10/2019 | |

OTHER PUBLICATIONS

Klimesch, et al., Encyclopedia of Materials and Science and Technology, 2001 Elsevier Science Ltd. Polyethylene High-Pressure pp. 7181-7184.
European Search Report dated Jan. 27, 2021.
J. Brandrup, E.H. Eds. Polymer Handbook, 3rd ed. Wiley, New York, 1989 Chapter 3.
Chinese Application No. 202180045929.4, Office Action dated Aug. 13, 2024.
Borealis AG, Indian Application No. 201917034522, Oct. 18, 2019.

* cited by examiner

POLYMER COMPOSITION WITH IMPROVED STORAGE STABILITY

The present invention relates to a polymer composition (I) comprising at least (A) a specific polymer selected from a polyolefin elastomer or a specific polymer of ethylene (B) a specific copolymer of ethylene and (C) a specific compound according to Formula (a). In addition, the present invention refers to a photovoltaic module comprising at least one layer comprising polymer composition (I), to a method for improving the storage stability and/or transport stability of polymer (A) and to the use of components (B) and (C) for improving the storage stability and/or transport stability of a polymer (A).

The polymer composition (I) according to the present invention is very well suited as encapsulation material for solar cells.

Polymer compositions suited as encapsulant material for solar cells are already known from the prior art.

EP 2 144 301 A1 refers to a photovoltaic module comprising a solar cell element and an insulation material laminated to at least one side of the solar cell element, wherein the insulation material comprises an olefin copolymer which comprises silane group-containing monomer units, to a process for the production of such a photovoltaic module, and to the use of an olefin copolymer which comprises silane group-containing monomer units for the production of an insulation layer of a photovoltaic module.

WO 2017/076629 A1 relates to a photovoltaic module (PV) and to a lamination process for producing said PV module.

WO 2019/158520 A1 refers to a polymer composition, to an article comprising the polymer composition, preferably to an article comprising at least one layer element (LE) comprising the polymer composition, and to a process for producing said article.

US 2014/045990 A1 relates to an olefin-based ionomer resin composition, to an encapsulant, and to an optoelectronic device. The resin composition may be used as an encapsulant for a variety of optoelectronic devices.

CN 108517188 A refers to a photovoltaic encapsulating material with high light transmittance. The photovoltaic encapsulating material is prepared by premixing 100 parts by weight of matrix resin or grafting modified matrix resin of the photovoltaic encapsulating material, 0.01 to 20 parts by weight of highly transparent resin with high light transmittance and/or high refractive index, and other auxiliary agents, and then carrying out melting, extruding, tape casting, film forming, cooling, cutting, and rolling.

The encapsulant materials known form the prior art do not show very good storage and/or transport properties stabilities.

Potential Induced Degradation (PID) is an undesirable effect on solar modules. PID, as the name implies, can occur when the module's voltage potential and leakage current drive ion mobility within the module between the semiconductor material and other elements of the module (e.g. glass, mount and frame), thus causing the module's power output capacity to degrade, in some cases significantly.

The use of the polymer compositions known from the prior art as encapsulant material does not allow to obtain photovoltaic modules showing an acceptable PID resistance.

Starting therefrom it was an objective of the present invention to provide polymer compositions having a very good storage and/or transport stability and in addition allow to manufacture photovoltaic modules with increased PID resistance allowing to obtain a high long-term Pmax, such as after 96 hours.

These objectives have been solved by polymer composition (I) according to claim 1 comprising at least the following components:

(A) 87.00 to 99.79 wt.-% based on the overall weight of the polymer composition (I) of a polymer selected from an ethylene-vinylacetate copolymer, a polyolefin elastomer or a polymer of ethylene (a), wherein the polymer of ethylene (a) is selected from
 (a1) a copolymer of ethylene which bears functional groups containing units;
 (a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears functional groups containing units different from said polar comonomer unit(s);
 (a3) a copolymer of ethylene comprising one or more alpha-olefin comonomer unit(s); and optionally bears functional groups containing units different from said polar comonomer unit(s) of polymer (a2); or mixtures thereof; and
 (b) silane group(s) containing units;
(B) 0.20 to 10.00 wt.-% based on the overall weight of the polymer composition (I) of a copolymer of ethylene, which bears functional group containing units originating from at least one unsaturated carboxylic acid and/or its anhydrides, metal salts, esters, amides or imides and mixtures thereof, whereby component (B) is different from component (A);
(C) 0.01 to 3.00 wt.-% based on the overall weight of the polymer composition (I) of a compound according to Formula (a);

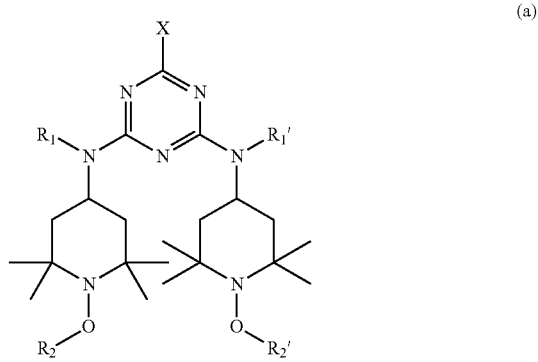

whereby components (A), (B) and (C) add up to 100 wt.-%.

Advantageous embodiments of polymer composition (I) in accordance with the present invention are specified in the dependent claims 2 to 9. Claim 10 relates to a photovoltaic module comprising at least one layer comprising polymer composition (I) according to the present invention and claims 11 and 12 refer to specific embodiments of said photovoltaic modules.

Claim 13 relates to a method for improving the storage stability and/or transport stability of polymer (A) and claim 14 specifies a specific embodiment of said method. Claim 15 refers to the use of components (B) and (C) for improving the storage stability and/or transport stability of component (A) and claim 16 relates to the use of polymer composition (I) in a photovoltaic module.

Definitions

Indications of Quantity

The polymer composition (I) in accordance with the present invention mandatorily comprises the components (A), (B) and (C), and optionally component (B2) and/or additives (D). The requirement applies here that the components (A), (B) and (C) and if present component (B2) and/or the additives (D) add up to 100 wt.-% in sum. The fixed ranges of the indications of quantity for the individual components (A), (B), (C) and optionally component (B2) and/or the additives (D) are to be understood such that an arbitrary quantity for each of the individual components can be selected within the specified ranges provided that the strict provision is satisfied that the sum of all the components (A), (B), (C), and optionally component (B2) and/or the additives (D) add up to 100 wt.-%.

An "element" in connection with the photovoltaic module of the present invention means a self-contained unit of the photovoltaic module. The elements of the photovoltaic module are preferably connected to form the photovoltaic module by lamination.

"Front" in connection with the photovoltaic module of the present invention means the planar side of the photovoltaic module facing towards the solar irradiation.

"Back" in connection with the photovoltaic module of the present invention means the planar side of the photovoltaic module facing away from the solar irradiation.

The "photovoltaic cell element" is the element of the photovoltaic module which converts the energy of light directly into electricity by the photovoltaic effect. Silicon based material, e.g. crystalline silicon, is a non-limiting example of materials used in photovoltaic cell(s). Crystalline silicon material can vary with respect to crystallinity and crystal size, as well known to a skilled person. Alternatively, the photovoltaic cell element can be a substrate layer on one surface of which a further layer or deposit with photovoltaic activity is subjected, for example a glass layer, wherein on one side thereof an ink material with photovoltaic activity is printed, or a substrate layer on one side thereof a material with photovoltaic activity is deposited. For instance, in well-known thin film solutions of photovoltaic cell elements e.g. an ink with photovoltaic activity is printed on one side of a substrate, which is typically a glass substrate.

"Photovoltaic cell(s)" means herein a layer element of photovoltaic cells, as explained above, together with connectors.

"Rigid" in connection with the photovoltaic module of the present invention means that the element is stiff and cannot be bended in a manner as flexible elements, and if bended, then typically the integrity of the element typically breaks easily causing permanent fractures, as is not the case with a flexible element. A skilled person can easily differentiate a rigid and flexible layer element.

A polymer of ethylene herein denotes a polymer which comprises a weight majority of ethylene monomer units, i.e. more than 50 wt.-% of ethylene monomer units.

"Comonomer" herein refers to copolymerisable comonomer units.

A "silane group(s) containing unit" herein refers to a chemical moiety which comprises one or more silyl groups. The "silane group(s) containing unit" can be part of a polymer or chemical compound which is different from the polymer of ethylene (a). The silane group(s) containing polymer or compound is then added to the polymer composition by blending with the polymer of ethylene (a). The "silane group(s) containing unit" can be part of the polymer of ethylene (a). Thereby, the "silane group(s) containing unit" can be a copolymerizable comonomer unit or a unit which can be chemically grafted onto the polymer of ethylene (a).

A "functional group(s) containing unit" herein refers to a substituent or chemical moiety which is responsible for the characteristic chemical reaction of the accordant polymer or compound.

The retained Pmax is determined according to IEC 60904. Pmax is the power that the PV module generates from a flash pulse of 1000 W/m² at standard test conditions (STC). From the IV-curve generated at the flash test, Pmax is obtained from the equation below where $I_{sc}$ is the short-circuit current, $V_{oc}$ is the open-circuit voltage and FF is the fill factor.

$$P_{max} = V_{oc} * I_{sc} * FF$$

Where the term "comprising" is used in the present description and claims, it does not exclude other non-specified elements of major or minor functional importance. For the purposes of the present invention, the term "consisting of" is considered to be a preferred embodiment of the term "comprising of". If hereinafter a group is defined to comprise at least a certain number of embodiments, this is also to be understood to disclose a group, which preferably consists only of these embodiments.

Whenever the terms "including" or "having" are used, these terms are meant to be equivalent to "comprising" as defined above.

Where an indefinite or definite article is used when referring to a singular noun, e.g. "a", "an" or "the", this includes a plural of that noun unless something else is specifically stated.

Component (A)

The polymer composition (I) in accordance with the present invention comprises as component (A) from 87.00 to 99.79 wt.-% based on the overall weight of the polymer composition (I) of a polymer selected from an, ethylene-vinylacetate copolymer, a polyolefin elastomer or a polymer of ethylene (a) selected from (a1) a copolymer of ethylene which bears functional groups containing units; (a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears functional groups containing units different from said polar comonomer unit(s); (a3) a copolymer of ethylene comprising one or more alpha-olefin comonomer unit(s); and optionally bears functional groups containing units different from said polar comonomer unit(s) of polymer (a2); or mixtures thereof; and (b) silane group(s) containing units.

Preferred embodiments of component (A) will be discussed in the following.

According to a preferred embodiment in accordance with the present invention component (A) comprises and preferably consists of (a1) a copolymer of ethylene which bears silane group(s) containing units (b) as functional groups containing units; or (a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears silane group(s) containing units (b) as functional groups containing units different from said polar comonomer unit(s).

Another preferred embodiment of the present invention stipulates that component (A) is (a1) a copolymer of ethylene which bears silane group(s) containing units (b) as functional groups containing units; or (a2) a polymer of ethylene comprising methyl acrylate comonomer units and bears silane group(s) containing units (b) as functional groups containing units different from said polar comonomer unit(s).

Still another preferred embodiment of the present invention stipulates that component (A) is a copolymer of ethylene (a1) with vinyl trimethoxysilane comonomer units or a terpolymer of ethylene (a2) with methyl acrylate comonomer units and vinyl trimethoxysilane comonomer units. The content of the methyl acrylate comonomer units present in the polymer of ethylene (a2) is preferably in the range of 4.5 to 18 mol-%, more preferably of 5.0 to 18.0 mol-%, still more preferably of 6.0 to 18.0 mol-%, even more preferably of 6.0 to 16.5 mol-%, even still more preferably of 6.8 to 15.0 mol-%, most preferably of 7.0 to 13.5 mol-%. The content of the vinyl trimethoxysilane comonomer units (b) present in the polymer of ethylene (a2) is preferably in the range of 0.01 to 1.00 mol-%, more preferably of 0.05 to 0.80 mol-% and still more preferably of 0.10 to 0.60 mol-%.

In another preferred embodiment of the present invention component (A) is different from a polyolefin elastomer and/or an ethylene-vinylacetate copolymer.

According to a further preferred embodiment in accordance with the present invention the content of component (A) in polymer composition (I) is in the range of 92.50 to 99.45 wt. %, preferably in the range of 95.0 to 98.9 wt.-% and more preferably from 97.0 to 98.85 wt.-% based on the overall weight of the polymer composition (I).

According to another preferred embodiment of the present invention the alpha-olefin comonomer(s) of polymer of ethylene (a3) are preferably selected from alpha olefins having from 3 to 12 carbon atoms, more preferably from alpha olefins having from 4 to 8 carbon atoms, such as 1-butene, 1-hexene or 1-octene.

In still another preferred embodiment the content of alpha-olefin comonomer(s) of polymer of ethylene (a3), is preferably of 4.5 to 18 mol-%, preferably of 5.0 to 18.0 mol-%, more preferably of 6.0 to 18.0 mol-%, preferably of 6.0 to 16.5 mol-%, more preferably of 6.8 to 15.0 mol-%, more preferably of 7.0 to 13.5 mol-%.

The silane group(s) containing units (b) and the polymer (a) can be present as separate components, i.e. as blend, in the polymer composition of the invention. Alternatively, the silane group(s) containing units (b) can be present as a comonomer of the polymer (a) or as a compound grafted chemically to the polymer (a). In general, copolymerisation and grafting of the silane group(s) containing units to ethylene are well known techniques and well documented in the polymer field and within the skills of a skilled person.

In case of a blend, the silane group(s) containing units (b) component can be a silane group(s) containing polymer or a silane group(s) containing compound. Said silane group(s) containing compound may, at least partly, be reacted chemically with the polymer (a), e.g. grafted to polymer (a), using optionally e.g. a radical forming agent, such as peroxide. Such chemical reaction may take place before or during the lamination process of the invention.

Preferably the silane group(s) containing units (b) are present (bonded) in the polymer (a). More preferably, the polymer (a) bears functional group(s) containing units, whereby said functional group(s) containing units are said silane group(s) containing units (b). In this embodiment the silane group(s) containing units (b) can be copolymerised or grafted to the polymer (a). Accordingly, the silane group(s) containing units (b) as the preferable functional group(s) containing units are preferably present in said polymer (a) in form of comonomer units or in form of grafted compounds.

In a more preferable embodiment of the present invention, the polymer (a) comprises functional group(s) containing units which are the silane group(s) containing units (b) as comonomer in the polymer (a). The copolymerisation provides more uniform incorporation of the units (b). Moreover, the copolymerisation does not require the use of peroxide which is typically needed for the grafting of said units to polyethylene. It is known that peroxide brings limitations to the choice of MFR of the polymer used as a starting polymer (during grafting the MFR of the polymer decreases since the peroxide not only initiates the grafting but also crosslinks the polymer) for a PV module and the decomposition products formed from peroxide can deteriorate the quality of the polymer.

The silane group(s) containing comonomer unit or compound as the silane group(s) containing units (b) is suitably a hydrolysable unsaturated silane compound represented by the formula

$$R1SiR2_qY3{-}q \tag{I}$$

wherein

R1 is an ethylenically unsaturated hydrocarbyl, hydrocarbyloxy or (meth)acryloxy hydrocarbyl group, each R2 is independently an aliphatic saturated hydrocarbyl group, Y which may be the same or different, is a hydrolysable organic group and q is 0, 1 or 2.

In one embodiment of silane group(s) containing units (b) of the invention, comonomers/compounds of formula (I) are selected from vinyl trimethoxysilane, vinyl bismethoxyethoxysilane, vinyl triethoxysilane, vinyl trimethoxysilane. Mostly preferred is vinyl trimethoxysilane.

The amount of the silane group(s) containing units (b) present in the polymer (a), is from 0.01 to 1.00 mol-%, preferably from 0.05 to 0.80 mol-%, more preferably from 0.10 to 0.60 mol-%, still more preferably from 0.10 to 0.50 mol-%.

The polymer of ethylene (a) preferably has a melt flow rate $MFR_2$ (2.16 kg; 190° C.) of less than 20 g/10 min, more preferably from 0.1 to 15 g/10 min, even more preferably from 0.2 to 13 g/10 min, still more preferably from 0.3 to 13, most preferably from 2.0 to 8.0 g/10 min.

The density of the polymer of ethylene (a) preferably is higher than 860 kg/m³. Preferably the density is not higher than 970 kg/m³, and more preferably is from 920 to 960 kg/m³, determined according to ISO 1872-2.

The polymer (a) of the polymer composition can be e.g. commercially available or can be prepared according to or analogously to known polymerization processes described in the chemical literature. Further details of the production of ethylene (co)polymers by high pressure radical polymerization can be found i.a. in the Encyclopedia of Polymer Science and Engineering, Vol. 6 (1986), pp 383-410 and Encyclopedia of Materials: Science and Technology, 2001 Elsevier Science Ltd.: "Polyethylene: High-pressure, R. Klimesch, D. Littmann and F.-O. Mähling pp. 7181-7184.

Component (B)

Besides components (A) and (C) the polymer composition (I) in accordance with the present invention mandatorily comprises as component (B) from 0.20 to 10.00 wt.-% based on the overall weight of the polymer composition (I) of a copolymer of ethylene, which bears functional group containing units originating from at least one unsaturated carboxylic acid and/or its anhydrides, metal salts, esters, amides or imides and mixtures thereof, whereby component (B) is different from component (A).

In the following preferred embodiments of component (B) will be discussed.

In a preferred embodiment in accordance with the present invention component (B) is a copolymer of ethylene and a C4 to C10 alpha olefin comonomer, preferably a copolymer of ethylene and 1-octene; whereby said copolymer before introducing the functional group has a density in the range of 850 kg/m$^3$ to 920 kg/m$^3$, preferably in the range of 860 to 905 kg/m$^3$, more preferably in the range of 865 to 905 kg/m$^3$, still more preferably in the range of 890 to 910 kg/m$^3$ measured according to ISO 1183.

Another preferred embodiment according to the present invention stipulates that before introducing the functional group component (B) has an MFR$_2$ in the range of 0.1 to 20.0 g/10 min, preferably in the range of 0.5 to 10 g/10 min and more preferably in the range of 6.0 to 8.0 g/10 min measured according to ISO 1133 at 190° C. and a load of 2.16 kg.

Another preferred embodiment according to the present invention stipulates that after introducing the functional group component (B) has an MFR$_2$ in the range of 0.1 to 10.0 g/10 min, preferably in the range of 0.5 to 5 g/10 min and more preferably in the range of 2.5 to 3.5 g/10 min measured according to ISO 1133 at 190° C. and a load of 2.16 kg.

C4 to C8 alpha-olefin comonomers are for example 1-butene, 1-hexene or 1-octene. Preferably, the comonomer is 1-butene or 1-octene, more preferably the comonomer is 1-octene. The amount of comonomer is usually in the range of 20.0 wt.-% to 45.0 wt.-%, depending on the chosen comonomer and the desired density. Suitable copolymers (a) have an ethylene content in the range from 55 to 80 wt.-%, preferably from 58 to 78 wt.-% and more preferably from 60 to 75 wt.-%.

According to a further preferred embodiment of the present invention the copolymer of ethylene for component (B) is a copolymer of ethylene and methyl acrylate or a copolymer of ethylene and butyl acrylate.

In still another preferred embodiment according to the present invention component (B) bears functional group containing units originating from a compound selected from the group consisting of maleic anhydride, acrylic acid, methacrylic acid, crotonic acid, fumaric acid, fumaric acid anhydride, maleic acid, citraconic acid and mixtures thereof, preferably originating from maleic anhydride.

According to a further preferred embodiment of the present invention component (B) is obtained by copolymerising and/or grafting a copolymer of ethylene with a compound selected from the group consisting of maleic anhydride, acrylic acid, methacrylic acid, crotonic acid and mixtures thereof, whereby grafting with maleic anhydride is preferred.

Grafting can be carried out by any process known in the art such as grafting in a melt without a solvent or in solution or dispersion or in a fluidised bed. Typically, grafting is performed in a heated extruder or mixer as e.g. described in U.S. Pat. No. 3,236,917 A, 4,639,495 A, 4,950,541 A or 5,194,509 A. Typically, grafting is carried out in a twin-screw extruder such as described in U.S. Pat. No. 4,950,541 A. Grafting may be carried out in the presence or absence of a radical initiator but is preferably carried out in the presence of a radical initiator such as an organic peroxide, organic perester or organic hydroperoxide.

Still another preferred embodiment in accordance with the present invention stipulates that the content of the functional group containing units originating from unsaturated carboxylic acids or carboxyl acid anhydrides in component (B) is in the range of 0.01 to 2.0 wt.-%, preferably in the range of 0.02 to 1.5 wt.-% and more preferably in the range of 0.20 to 1.0 wt.-%.

Another preferred embodiment stipulates that component (B) is a copolymer of ethylene and 1-octene grafted with maleic anhydride, preferably the content of 1-octene is in the range of 20 to 45 wt.-%, preferably in the range of 22 to 42 wt.-% and more preferably in the range of 25 to 40 wt.-% and still more preferably in the range of 28 to 32 wt.-% based on the overall weight of the copolymer of ethylene and 1-octene and the content of maleic anhydride is in the range of 0.01 to 2.0 wt.-%, preferably in the range of 0.02 to 1.5 wt.-% and more preferably in the range of 0.20 to 1.0 wt.-% based on the overall weight of component (B).

According to another preferred embodiment in accordance with the present invention the melting points of component (B) is in the range of 30° C. to below 100° C., preferably in the range of 30° C. to below 90° C., more preferably in a range of 30° C. to below 80° C. and most preferably in a range of 30° C. to below 70° C. According to another preferred embodiment in accordance with the present invention the dispersity Mw/Mn of component (B) is most often below 4, such as 3.8 or below, but is at least 1.7. It is preferably between 3.5 and 1.8.

Suitable base copolymers, these means before introducing the functional groups, for component (B) are commercially available, i.a. from Borealis AG under the tradename Queo, from DOW under the tradename Engage or Affinity, or from Mitsui under the tradename Tafmer.

Alternately these base copolymers can be prepared by known processes, in a one stage or two stage polymerization process, comprising solution polymerization, slurry polymerization, gas phase polymerization or combinations therefrom, in the presence of suitable catalysts, like vanadium oxide catalysts or single-site catalysts, e.g. metallocene or constrained geometry catalysts, known to the art skilled persons. A suitable process is inter alia described in WO 2019/201934A1.

A known solution technology suitable for the process according to the invention is the BORCEED (former COMPACT) technology.

In a further preferred embodiment in accordance with the present invention the content of component (B) in polymer composition (I) is in the range of 0.5 to 5.0 wt. %, preferably in the range of 1.0 to 3.0 wt.-% and more preferably from 1.0 to 2.0 wt.-% based on the overall weight of the polymer composition (I).

Optional Component (B2)

Besides mandatory components (A) to (C), the polymer composition (I) in accordance with the present invention can comprise a component (B2), which is a copolymer of ethylene and (meth)acrylic acid. In one preferred embodiment, the optional component (B2) is a copolymer of ethylene and methacrylic acid.

The copolymer of ethylene and (meth)acrylic acid can be a copolymer, which is prepared with an amount of (meth)acrylic acid in the range of 1 to 25 wt. %, preferably 3 to 20 wt. %, and more preferably 5 to 15 wt. % based on the overall weight of the copolymer. For example, the copolymer of ethylene and (meth)acrylic acid can be prepared with an amount in the range of 8 to 10 wt. % of (meth)acrylic acid such as 9 wt. %. Thus, the copolymer can have a (meth)

acrylic acid content in the range of 8 to 10 wt.-%, based on the overall weight of the copolymer.

The copolymer of ethylene and (meth)acrylic acid can have an $MFR_2$ in the range of 0.2 to 10.0 g/10 min, preferably in the range of 0.5 to 5 g/10 min and more preferably in the range of 1.5 to 3.5 g/10 min measured according to ISO 1133 at 190° C. and a load of 2.16 kg. For example, the copolymer of ethylene and (meth)acrylic acid can have an $MFR_2$ in the range of 2.0 to 3.0 g/10 min, e.g. 2.5 g/10 min.

In one embodiment, the copolymer of ethylene and (meth)acrylic acid has a melting point in the range of 75 to 125° C., and preferably 90 to 110° C.

According to one preferred embodiment, the optional component (B2) is a copolymer of ethylene and methacrylic acid, wherein the copolymer is prepared with an amount of methacrylic acid in the range of 1 to 25 wt. %, preferably 3 to 20 wt. %, and more preferably 5 to 15 wt. %, wherein the copolymer has an $MFR_2$ in the range of 0.2 to 10.0 g/10 min, preferably in the range of 0.5 to 5 g/10 min and more preferably in the range of 1.5 to 3.5 g/10 min measured according to ISO 1133 at 190° C. and a load of 2.16 kg, and wherein the copolymer has a melting point in the range of 75 to 125° C., and preferably 90 to 110° C.

The copolymer of ethylene and (meth)acrylic acid may be present in the composition (I) in an amount in the range of 0.05 to 5 wt.-%, preferably 0.10 to 2.5 wt.-%, and more preferably in an amount of 0.10 to 1.5 wt.-%, based on the overall weight of the composition. For example, the copolymer of ethylene and (meth)acrylic acid may be present in the composition (I) in an amount in the range of 0.05 to 0.5 wt.-% or in a range of 0.75 to 1.5 wt.-%.

Suitable as optional component (B2) is NUCREL™ 0903, which is commercially available from Dow DuPont.

Component (C)

Besides component (A) and (B) the polymer composition (I) in accordance with the present invention mandatorily comprises as component (C) from 0.01 to 3.00 wt.-% based on the overall weight of the polymer composition (I) of a compound according to Formula (a)

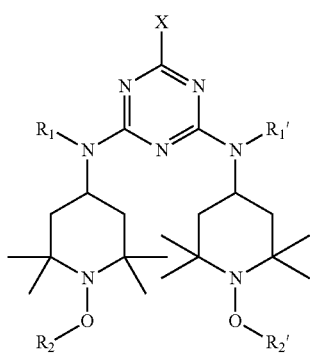

(a)

wherein;

R1, R1', R2 and R2' are each independently selected from the group consisting of hydrogen, n-alkyl, iso-alkyl, alkoxy, cycloalkyl, alkenyl, halogen and mixtures thereof; and X is selected from the group consisting of primary amines, secondary amines, tertiary amines, hydrogen, alkyl, alkenyl and mixtures thereof.

In the following preferred embodiments of component (C) will be discussed.

According to a preferred embodiment in accordance with the present invention component (C) is a compound represented by Formula (a); wherein R1 and R1' are each independently n-alkyl groups, preferably having from 3 to 9 carbon atoms, more preferably R1 and R1' are the same and most preferably R1 and R1' are n-butyl; and/or R2 and R2' are each independently n-alkyl or cyclo-alkyl groups, more preferably R2 and R2' are cyclo-alkyl groups, still more preferably are R2 and R2' are the same and most preferably R2 and R2' are cyclohexyl; and/or X is selected from the group consisting of secondary and tertiary amines, preferably having from 1 to 8 secondary and/or tertiary amino groups and more preferably having 4 amino groups.

Still another preferred embodiment in accordance with the present invention stipulates that component (C) has a molecular weight in the range of 1000 to 2800 g/mol, preferably in the range of 2000 to 2600 g/mol and more preferably in the range of 2100 to 2300 g/mol.

According to a further preferred embodiment in accordance with the present invention component (C) is a compound having the following Formula (b):

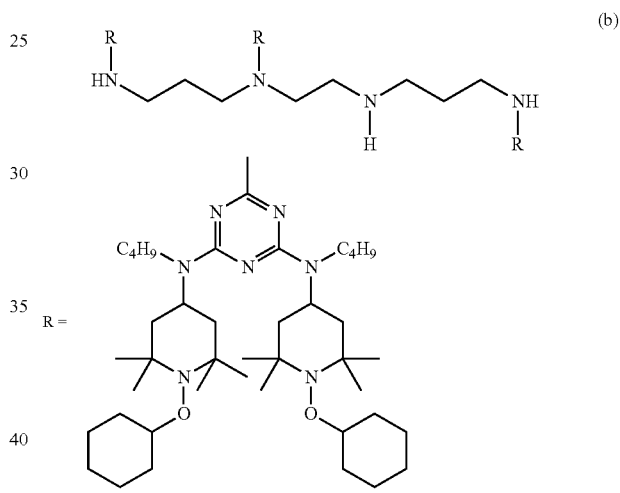

(b)

The compound according to Formula (b) is commercially available from BASF SE under the tradename Flamestab® NOR 116.

In a further preferred embodiment of the present invention the content of component (C) in polymer composition (I) is in the range of 0.05 to 2.50 wt. %, preferably in the range of 0.15 to 1.00 wt.-% and more preferably from 0.15 to 1.00 wt.-% based on the overall weight of the polymer composition (I).

Without being bound to any theory it is believed that component (C) is able to bind sodium ions, which significantly contribute to PID, as chelate (see below).

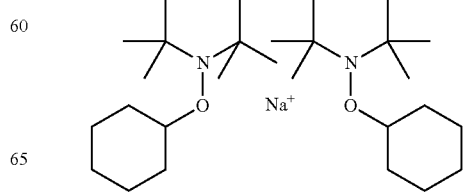

Additives

According to a preferred embodiment in accordance with the present invention polymer composition (I) comprises at least one additive (D) selected from the group consisting of metal deactivators, nucleating agents, clarifiers, optical brighteners, acid scavengers, slip agents, pigments, fillers and flame retardants, tackifiers, plasticisers, crosslinking agents, crosslinking boosters, wavelength-shifting agents and mixtures thereof.

Still another preferred embodiment in accordance with the present invention stipulates that the content of said additive (D) based on the overall weight of the polymer composition (I) is in the range of 0.0001 to 10 wt.-%, preferably in the range from present of 0.01 to 5.0 wt.-% and more preferably in the range of 0.1 to 2.5 wt.-%.

The additives may be added in form of a Masterbatch, the ranges for the content specified above relate to the pure additive.

Polymer Composition (I)

The polymer composition (I) in accordance with the present invention mandatorily comprises components (A), (B) and (C).

According to a preferred embodiment of the present invention the content of component (A) in polymer composition (I) is in the range of 92.50 to 99.45 wt. %, preferably in the range of 95.0 to 98.9 wt.-% and more preferably from 97.00 to 98.85 wt.-% based on the overall weight of the polymer composition (I).

In a further preferred embodiment of the present invention the content of component (B) in polymer composition (I) is in the range of 0.50 to 5.00 wt. %, preferably in the range of 1.00 to 3.00 wt.-% and more preferably from 1.00 to 2.00 wt.-% based on the overall weight of the polymer composition (I).

Still another preferred embodiment of the present invention stipulates that the content of component (C) in polymer composition (I) is in the range of 0.05 to 2.50 wt. %, preferably in the range of 0.10 to 2.00 wt.-% and more preferably from 0.15 to 1.00 wt.-% based on the overall weight of the polymer composition (I).

In another preferred embodiment according to the present invention the polymer composition (I) is not cross-linked in the presence of a peroxide or a silanol condensation catalyst selected from carboxylates of tin, zinc, iron, lead or cobalt or aromatic organic sulphonic acids.

Still another preferred embodiment of the present invention stipulates that polymer composition (I) comprises the following components:

(A) 96.50 to 98.99 wt.-% of a terpolymer of ethylene (a2) with methyl acrylate comonomer units and vinyl trimethoxysilane comonomer units;
(B) 1.00 to 3.00 wt.-% of a copolymer of ethylene and a C4 to C10 alpha olefin comonomer, and
(C) 0.01 to 0.50 wt.-% of a compound according to Formula (a), wherein R1 and R1' are each independently n-alkyl groups, preferably having from 3 to 9 carbon atoms, more preferably R1 and R1' are the same and most preferably R1 and R1' are n-butyl; and R2 and R2' are each independently n-alkyl or cyclo-alkyl groups, more preferably R2 and R2' are cyclo-alkyl groups, still more preferably are R2 and R2' are the same and most preferably R2 and R2' are cyclohexyl; and X is selected from the group consisting of secondary and tertiary amines, preferably having from 1 to 8 secondary and/or tertiary amino groups and more preferably having 4 amino groups.

According to a further preferred embodiment in accordance with the present invention polymer composition (I) comprises the following components: (A) 96.50 to 96.99 wt.-% of a terpolymer of ethylene (a2) with methyl acrylate comonomer units and vinyl trimethoxysilane comonomer units; (B) 1.00 to 3.00 wt.-% of a copolymer of ethylene and a C8 alpha olefin comonomer and (C) 0.01 to 0.5 wt.-% of a compound according to Formula (b).

According to a further preferred embodiment the polymer composition (I) comprises and preferably consists of components (A), (B), (C) and optionally additives (D).

In one preferred embodiment of the present invention, the polymer composition (I) further comprises component (B2). In case optional component (B2) is present in the polymer composition (I) according to the invention, component (B2) is different from components (A) and (B).

The polymer composition (I) may comprise component (B2) in an amount in the range of 0.05 to 5 wt.-%, preferably 0.10 to 2.5 wt.-%, and more preferably in an amount of 0.10 to 1.5 wt.-%, based on the overall weight of the composition.

According to one preferred embodiment, polymer composition (I) comprises the following components:

(A) 94.50 to 98.99 wt.-% of a terpolymer of ethylene (a2) with methyl acrylate comonomer units and vinyl trimethoxysilane comonomer units;
(B) 0.25 to 3.00 wt.-%, preferably 1.00 to 3.00 wt.-%, of a copolymer of ethylene and a C4 to C10 alpha olefin comonomer;
(B2) 0.10 to 2.5 wt. % of a copolymer of ethylene and methacrylic acid, and
(C) 0.01 to 0.50 wt.-% of a compound according to Formula (a), wherein R1 and R1' are each independently n-alkyl groups, preferably having from 3 to 9 carbon atoms, more preferably R1 and R1' are the same and most preferably R1 and R1' are n-butyl; and R2 and R2' are each independently n-alkyl or cyclo-alkyl groups, more preferably R2 and R2' are cyclo-alkyl groups, still more preferably are R2 and R2' are the same and most preferably R2 and R2' are cyclohexyl; and X is selected from the group consisting of secondary and tertiary amines, preferably having from 1 to 8 secondary and/or tertiary amino groups and more preferably having 4 amino groups.

According to a further preferred embodiment in accordance with the present invention polymer composition (I) comprises the following components:

(A) 94.50 to 98.99 wt.-% of a terpolymer of ethylene (a2) with methyl acrylate comonomer units and vinyl trimethoxysilane comonomer units;
(B) 0.25 to 3.00 wt.-%, preferably 1.00 to 3.00 wt.-%, of a copolymer of ethylene and a C4 to C10 alpha olefin comonomer;
(B2) 0.10 to 2.5 wt. % of a copolymer of ethylene and methacrylic acid, and
(C) 0.01 to 0.50 wt.-% of a compound according to Formula (b).

According to a further preferred embodiment the polymer composition (I) comprises and preferably consists of components (A), (B), (B2), (C) and optionally additives (D).

Photovoltaic Module

The present invention also relates to a photovoltaic module comprising at least one layer comprising polymer composition (I) according to the present invention. It is preferred that the layer comprising polymer composition (I) and preferably consisting of said polymer composition (I) is an encapsulant layer.

According to still another preferred embodiment in accordance with the present invention the photovoltaic module comprises a front encapsulant layer element and rear encapsulant layer element, whereby at least one of these encapsulant layer elements and preferably both encapsulant layer elements comprise polymer composition (I) and more preferably consist of polymer composition (I).

According to a preferred embodiment of the present invention the retained Pmax determined according to IEC 60904 of the photovoltaic module is above 95%, preferably in the range of 95 to 100% and more preferably in the range of 97 to 99.5%.

As known in the art, the elements and the layer structure of the photovoltaic module of the invention can vary depending on the desired type of the module. The photovoltaic module can be flexible or rigid. In a preferred embodiment the photovoltaic module is a rigid photovoltaic module.

In a further preferred embodiment of the present invention the protective front layer element is a rigid protective front layer element, preferably a front glass layer element and/or the protective back layer element is a rigid protective back layer element, preferably a back glass layer element.

According to another preferred embodiment in accordance with the present invention the protective back layer element is a polymeric backsheet. The polymeric material is preferably selected from the group consisting of polyethylenterephthalate, polyvinylidenefluoride, polyvinylfluoride and polypropylene.

The photovoltaic module of the invention can be produced in a manner well known in the field of the photovoltaic modules. The polymeric layer elements can be produced for example by extrusion, preferably by co- or cast film extrusion, in a conventional manner using the conventional extruder and film formation equipment. The layers of any multilayer element(s) and/or any adjacent layer(s) between two layer elements can be partly or fully coextruded or laminated.

The different elements of the photovoltaic module are typically assembled together by conventional means to produce the final photovoltaic module. Elements can be provided to such assembly step separately or e.g. two elements can fully or partly be in integrated form, as well known in the art. The different element parts can then be attached together by lamination using the conventional lamination techniques in the field. The assembling of photovoltaic module is well known in the field of photovoltaic modules.

All preferred aspects and embodiments as described above for the polymer composition (I) shall also hold for the photovoltaic module according to the present invention.

Method

The present invention also relates to a method for improving the storage stability and/or transport stability of a polymer (A) comprising the following steps:
a) providing polymer (A) selected from an ethylene-vinylacetate copolymer, a polyolefin elastomer or a polymer of ethylene (a), wherein the polymer of ethylene (a) is selected from
  (a1) a copolymer of ethylene which bears functional groups containing units;
  (a2) a copolymer of ethylene comprising one or more polar comonomer unit(s) selected from (C1-C6)-alkyl acrylate or (C1-C6)-alkyl (C1-C6)-alkyl acrylate comonomer units, and optionally bears functional groups containing units different from said polar comonomer unit(s);
  (a3) a copolymer of ethylene comprising one or more alpha-olefin comonomer unit(s); and optionally bears functional groups containing units different from said polar comonomer unit(s) of polymer (a2); or mixtures thereof; and
  (b) silane group(s) containing units;
b) providing a copolymer of ethylene (B), which bears functional group containing units originating from at least one unsaturated carboxylic acid and/or its anhydrides, metal salts, esters, amides or imides and mixtures thereof, whereby component (B) is different from component (A);
c) providing a compound according to Formula (a);

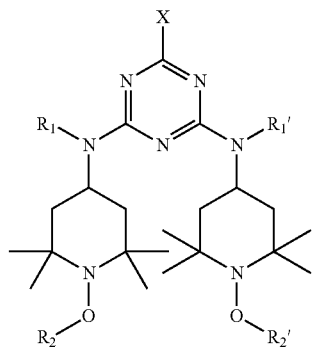

(a)

d) mixing polymer (A) and compounds (B) and (C) to obtain a stabilized polymer composition (I).

Steps a) to c) can be conducted in any order.

According to a preferred embodiment in accordance with the present invention component (A) comprises and preferably consists of (a1) a copolymer of ethylene which bears silane group(s) containing units (b) as functional groups containing units; or (a2) a polymer of ethylene comprising methyl acrylate comonomer units and bears silane group(s) containing units (b) as functional groups containing units different from said polar comonomer unit(s).

In another preferred embodiment according to the present invention component (B) is a copolymer of ethylene and a C4 to C10 alpha olefin comonomer, preferably a copolymer of ethylene and 1-octene; whereby said copolymer before introducing the functional group has
  (i) a density in the range of 850 kg/m$^3$ to 920 kg/m$^3$, preferably in the range of 865 to 905 kg/m$^3$, more preferably in the range of 865 to 910 kg/m$^3$ and more preferably in the range of 890 to 910 kg/m$^3$ measured according to ISO 1183; and/or
  (ii) an MFR$_2$ in the range of 0.1 to 20.0 g/10 min, preferably in the range of 0.5 to 10 g/10 min and more preferably in the range of 6.0 to 8.0 g/10 min measured according to ISO 1133 at 190° C. and a load of 2.16 kg.

Still another preferred embodiment in accordance with the present invention stipulates that component (C) is a compound having the following Formula (b):

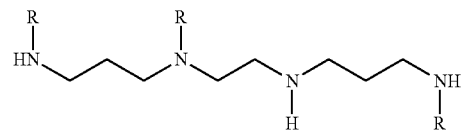

(b)

R = 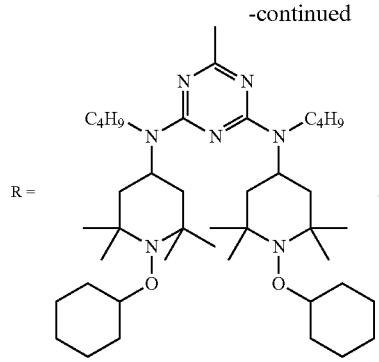

All preferred aspects and embodiments as described above for components (A) to (C) shall also hold for the method according to the present invention.

Use of Components (B) and (C) Another aspect of the present invention refers to the use of components (B) and (C) as defined above for improving the storage stability and/or transport stability of above defined component (A).

All preferred aspects and embodiments as described above for components (A) to (C) shall also hold for the use as stabilizer.

Use of Polymer Composition (I)

The present invention also relates to the use of polymer composition (I) in at least one layer of a photovoltaic module.

All preferred aspects and embodiments as described above for polymer composition (I) shall also hold for the use in at least one layer of a photovoltaic module.

The invention will now be described with reference to the following non-limiting examples.

EXPERIMENTAL PART

A. Measuring Methods

The following definitions of terms and determination methods apply for the above general description of the invention as well as to the below examples unless otherwise defined.

Melt Flow Rate

The melt flow rate (MFR) was determined according to ISO 1133—Determination of the melt mass-flow rate (MFR) and melt volume-flow rate (MVR) of thermoplastics—Part 1: Standard method and is indicated in g/10 min. The MFR is an indication of the flowability, and hence the processability, of the polymer. The higher the melt flow rate, the lower the viscosity of the polymer. The $MFR_2$ of polyethylene is determined at a temperature of 190° C. and a load of 2.16 kg.

Density

The density of the polymer was measured according to ISO 1183-2. The sample preparation was executed according to ISO 1872-2 Table 3 Q (compression moulding).

Comonomer Contents

The content (wt.-% and mol.-%) of the polar comonomer present in the copolymers of ethylene (component (A)) and the content (wt.-% and mol-%) of silane group(s) containing units present in said copolymers was determined as described in WO 2018/141672 A1 for the content (wt.-% and mol-%) of polar comonomer present in the polymer (a) and the content (wt % and mol %) of silane group(s) containing units (preferably comonomer) present in the polymer (a).

The alpha-olefin comonomer content present in the copolymer of ethylene (component (B)), was determined as described in WO 2019/134904 for the comonomer content quantification of poly(ethylene-co-1-octene) copolymers.

Dynamic Shear Measurements (Frequency Sweep Measurements)

The dynamic shear measurements are conducted as described in WO2018/141672 A1.

Melting Temperature (Tm), Crystallization Temperature (Tc), Heat of Fusion (ΔHfusion), Crystallization Enthalpy (ΔHcryst) and Degree of Crystallinity Tm, Tc, ΔHfusion and ΔHcryst were measured with a TA Instrument Q200 differential scanning calorimetry (DSC) on 5 to 7 mg samples. DSC is run according to ISO 11357/part 3/method C2 in a heat/cool/heat cycle with a scan rate of 10° C./min in the temperature range of −30 to +225° C. Crystallization temperature (Tc) and crystallization enthalpy (Hcryst) are determined from the cooling step, while melting temperature (Tm) and heat of fusion (Hfusion) are determined from the second heating step. The crystallinity is calculated from the heat of fusion by assuming an Hfusion-value of 209 J/g for a fully crystalline polypropylene (see Brandrup, J., Immergut, E. H., Eds. Polymer Handbook, 3rd ed. Wiley, New York, 1989; Chapter 3).

FTIR

FTIR was used for determining the content of grafting agent (maleicanhydride) in Polymer A.

Sample Preparation

A small amount of sample (pellets) was compression pressed (*) into films/plaques (thickness 0.5 mm) with aid of a compression mould und the conditions below.

(*) Pressing/Moulding
  4 minutes at 180° C. ("free melting", no pressure exerted)
    2 minutes at 180° C. under pressure (~45 kN)
  2 minutes cooling under pressure FTIR, Calculations IR spectra from the films/plaques were measured on a Bruker Tensor 27. Peaks intensities (relative to the baseline) are recorded; component peak (related to maleic anhydride) at between ~1782-1797 cm-1 (baseline 1847 cm-1) and reference peak at ~ 2641-2707 cm-1 (baseline 2450 cm-1). The value from component/reference was calculated and compared to the calibration curve, which resulted in the total maleic anhydride-content in the polymer. The maleic anhydride content in the calibration standards have been determined with the titration method described below.

Sample Preparation for Titration Method

The sample was mixed thoroughly. The sample was in the form of pellets.

Blind—Test

When heating xylene and dissolving the sample, close the container loosely with a ground glass stopper to allow the pressures to equalize and prevent the solution from splashing out of the bottle. For example, a piece of paper or a thin iron wire can be inserted between the neck of the bottle and the grinding cap to prevent the cap from sticking.

To 50 ml of xylene with a touch of antioxidant few drops of phenolphthalein indicator was added. Then the resulting solution was heated (>100° C.) with a magnetic stirrer and titrated hot with 0.02 N KOH/IPA solution. Colour change is noted: colourless→red (clear)

The titration takes up the indicator, titration is continued until the colour remains stable for about 10 seconds. The consumption is recorded.

Procedure for the Sample

Approximately 600 to 800 mg of sample pellets were weighed into an Erlenmeyer flask, then 50 ml of xylene with a touch of antioxidant (prevents oxidation of the product during machining) and magnetic stir bar added into the flask. As next the flask was stoppered and transferred to a heated magnetic stirrer located in the fume cupboard. Allowed the sample to dissolve. It took about 15 minutes for the sample to dissolve. Then few drops of phenolphthalein indicator were added. Sample was titrated hot (>100° C.) with 0.02 N KOH/IPA solution. The consumption is recorded. Color-change is noted: colorless→red (clear).

Calculation

Total acid content $(w\%) = (((Vn-Vs) \times N \times E(\text{acid}))/W) \times 100$ where:
N=normalization of the titration solution, mekv/ml
W=sample weight in g
Vn=sample consumption, ml Vs=blind consumption, ml
E=equivalent acid weight in g/mekv
E=(maleic acid)=0.116/2=0.058
E=(maleic anhydride)=0.098

The result was expressed to two decimal places (X, xx) as a percentage by weight.

PID Testing

The 1-cell PV modules prepared as described below underwent the PID stress testing according to the foil method as described in IEC62804-1: "Test methods for detection of potential-induced degradation of crystalline silicon photovoltaic (PV) modules". The foil method was applied, with a temperature of 85° C. and a relative humidity of 85% being the (controlled, stable) environmental stress conditions throughout the test duration, using a Memmert CTC256 climate chamber. A 1000 V potential difference was applied between the aluminium (Al) foils and the short-circuited solar cell. During PID stress, the solar cell was at a negative potential (−1000 V) with respect to the Al foils (0 V). Hence, driving positive charges towards the solar cell. The 1-cell modules laminates were put under bifacial PID stress, i.e. Al foils at high voltage difference to the solar cell attached to both the front and the rear SLG covers. The test duration for the PID-test was 96 h.

Flash Test

The PV power loss under PID stress was quantified using a pv-tools Halm certis PV-OS system for all 1-cell modules. All characterization measurements were conducted from both the front side and the rear side of the single-cell laminates using monofacial illumination and a black cloth underneath the laminate to reduce the reflected irradiance. The power output loss was calculated as the relative difference in Pmax before and after the 96 h PID test. All IV-characterisation was done in accordance with the IEC 60904 standard.

B. Starting Materials

Preparation of Polymer 1 (Copolymer of Ethylene with Methyl Acrylate Comonomer and with Vinyl Trimethoxysilane Comonomer)

The copolymer of ethylene with methyl acrylate comonomer and vinyl trimethoxysilane comonomer (polymer 1) was produced in a commercial high pressure tubular reactor at a pressure of 2500 to 3000 bar and maximum temperature of 250 to 300° C. using conventional peroxide initiator. Ethylene monomer, methyl acrylate (MA) polar comonomer and vinyl trimethoxy silane (VTMS) comonomer were added to the reactor system in a conventional manner. Chain transfer agent was used to regulate melt flow rate as well known for a skilled person. After having the information of the property balance desired for the final polymer 1, the skilled person can control the process to obtain polymer 1.

The amount of the vinyl trimethoxy silane units, VTMS, the amount of methyl acrylate, MA, and MFR$_2$ are given in the Table 1.

The properties in Table 1 were measured from Polymer 1 as obtained from the reactor.

TABLE 1

| Product properties of Polymer 1. | |
|---|---|
| Properties of the polymer obtained from the reactor | Polymer 1 |
| MFR$_{2,16}$, g/10 min | 4.5 |
| Methyl acrylate content, mol % (wt %) | 8.6 (22) |
| Melt Temperature, ° C. | 90 |
| VTMS content, mol % (wt %) | 0.38 (1.7) |
| Density, kg/m$^3$ | 946 |
| SHI (0.05/300), 150° C. | 52 |

In above Table 1 and below MA denotes the content of Methyl Acrylate comonomer present in the polymer and, respectively, VTMS content denotes the content of vinyl trimethoxy silane comonomer present in the polymer.

Polymer a (Copolymer of Ethylene with 1-Octene Grafted with Maleic Anhydride)

As base polymer Queo™ 0207LA was used. Queo™ 0207LA is an ethylene based 1-octene elastomer produced in a solution polymerization process using a metallocene catalyst with a MFR$_2$ (2.16 kg, 190° C.) of 6.5 g/10 min and a density of 902 kg/m$^3$ and is commercially available from Borealis AG, Austria.

Said base polymer was grafted with maleic anhydride on a Coperion ZSK32 (screw diameter d=32 mm) corotating twin screw extruder with a length of 48 L/d coupled to a BKG underwater pelletiser (UP). A Piovan cooler was used to reduce the UP process water temperature to 12° C. MAH briquettes were "milled" and mixed with the cryo-milled base polymer in a high-speed Mixaco mixer (1:6=1 part MAH, 5 parts base polymer). This "dilution" prevented re-agglomeration of the MAH and allowed accurate feeding of only 0.6 wt.-% of the modifier. For this, the stirrer-equipped additive feeder of the line was used.

Queo0207LA was grafted by adding various amounts of maleic anhydride (MAH). The peroxide initiator (0.1 wt.-% POX-Perkadox 14S-fl, Akzo Nobel) was fed as a 10% isododecane solution.

A dry blend of Queo 0207LA and MAH was fed through the hopper into the feeding section of the extruder. The POX solution was fed into a side feeding entrance into the feeding section of the extruder. The screw speed was 200 rpm and the throughput was 8 kg/h.

The residence time was 60 seconds. This resulted in a content of grafted maleic anhydride grafting of 1.05 wt.-% based on the total weight of polymer A, as determined by FTIR. The MFR$_2$ (2.16 kg, 190° C.) of the grafted material was 2.99 g/10 min Nucrel 0903

NUCREL™ 0903 is a copolymer of ethylene and methacrylic acid, made with nominally 9 wt.-% methacrylic acid. The MFR (190° C., 2.6 kg) is 2.5 g/10 min and the melting point is 101° C. NUCREL™ 0903 is supplied by Dow DuPont.

Stabilisers

Flamestab NOR-116: commercially available from BASF
CAS: 191680-81-6
Sabostab UV62: commercially available from BASF
CAS: 65447-77-0 Sabostab UV70: commercially available from BASF CAS: 52829-07-9

Sabostab UV94: commercially available from BASF CAS: 70624-18-9

C. Preparation of the Polymer Compositions, Films Thereof and Photovoltaic Modules (PV Modules)

a) Polymer Compositions

Table 2 shows the compositions of the polymer compositions according to Comparative Examples CE1 to CE4 and the Inventive Example IE1. These polymer compositions were obtained by blending Polymer 1 with the commercially available stabilisers and/or polymer A.

TABLE 2A

Polymer compositions CE1 to CE4 and IE1.

| Component | Unit | CE1 | CE2 | CE3 | CE4 | IE1 |
|---|---|---|---|---|---|---|
| Polymer 1 (A) | wt.-% | 98 | 98 | 99 | 98 | 96 |
| Polymer A (B) | wt.-% | — | — | — | — | 2 |
| Sabostab UV62 MB[a] | wt.-% | 2 | — | — | — | — |
| Sabostab UV62 | ppm | 1570 | — | — | — | — |
| Sabostab UV70/Sabostab UV94 MB[b] | wt.-% | — | 2 | 1 | — | — |
| Sabostab UV70 | ppm | — | 1250 | 625 | — | — |
| Sabostab UV94 | ppm | — | 312 | 156 | — | — |
| Flamestab NOR-116 MB[c] (C) | wt.-% | — | — | — | 2 | 2 |
| Flamestab NOR-116 (C) | ppm | — | — | — | 1570 | 1570 |

[a]MB comprises 92.15 EMA copolymer (24% MA, MFR2 (190° C.) = 2.0 g/10 min) and 7.85% stabilizer;
[b]MB comprises 92.15 EMA copolymer (24% MA, MFR2 (190° C.) = 2.0 g/10 min) and 7.85% stabilizer;
[c]MB comprise 92.15 EMA copolymer (24% MA, MFR2 (190° C.) = 2.0 g/10 min) and 7.85% stabilizer.

TABLE 2B

Polymer compositions IE2 to IE5

| Component | Unit | IE2 | IE3 | IE4 | IE5 |
|---|---|---|---|---|---|
| Polymer 1 (A) | wt.-% | 97.25 | 96.25 | 96.25 | 95.25 |
| Polymer A (B) | wt.-% | 0.5 | 0.5 | 1.5 | 1.5 |
| Nucrel 0903 (B2) | wt.-% | 0.25 | 1.25 | 0.25 | 1.25 |
| Flamestab NOR-116 MB[c] (C) | wt.-% | 2 | 2 | 2 | 2 | b) Films for Storage Stability Tests

For the storage stability tests described in chapter 0 below films consisting of polymer compositions CE1 to CE4 and IE1 (Trial 1) and consisting of polymer compositions IE2 to IE5 (Trial 2) were produced.

The films were produced on a Dr. Collin cast film line. First, the material went into the extruder, through the nozzle to an embossing roll and at last to two chilling rolls. The temperature of the extruder and nozzle was at 145° C. and had a feeding rate of 7.5 kg/in. The cooling rolls chilled the film down to 25° C. about 1.10 in/min. The film thickness was 480 μm thickness when the process was finished, with embossing on one side of the film with a depth at 100 μm. The embossing roll was from UNGRICHT GMBH+CO KG with the roll manufacture from Dr Collin GmbH and was cooled by water. The embossing of the film improved both the lamination behavior and re-winding of the film.

C) Preparation of the Photovoltaic Modules c1) Preparation of the Encapsulation Layer Element The encapsulation layer elements made of the polymer compositions CE1 to CE4 and IE1, with dimensions of 995 mm width and 0.45 mm thickness were prepared on a Dr. Collin cast film line, using a melt temperature of 145° C. and at lines speeds of 7.5 kg/h.

c2) Preparation of the PV Modules

Protective front layer element: Glass layer, structured solar glass, SIH, supplied by Inter Float, length: 200 mm and width: 300 mm, total thickness of 3.2 mm.

Front and rear encapsulant element: films of the polymer compositions CE1 to CE4 and IE1 as described above, with same width and length dimensions as the protective front and back layer element, each had the total thickness of 0.45 mm.

PV cell element: 1 soldered bifacial solar cell, cell dimension 156*156 mm from Trina Solar, pseudosquare, 5 busbars, total thickness of 200 micron.

Protective back layer element: Glass layer, structured solar glass, SIH, supplied by Inter Float, length: 200 mm and width: 300 mm, total thickness of 3.2 mm.

Two PV module assemblies were prepared for each encapsulation layer element as follows. The front protective glass element was cleaned with isopropanol before putting the first encapsulation layer element film on the solar glass. The solar glass element has the following dimensions: 200 mm×300 mm×3.2 mm (b*l*d). The front encapsulation layer element was cut in the same dimension as the solar glass element. After the front encapsulation layer element was put on the front protective glass element, then the soldered solar cell was put on the front encapsulation layer element. Further the rear encapsulation layer element was put on the obtained PV cell element and the back protective glass element was cleaned with isopropanol before it was put on said rear encapsulation layer element. The obtained PV module assembly was then subjected to a lamination process as described below.

Lamination Process:

Laminator: L036LAB, supplied by Siemens.

Each PV module assembly sample was laminated in an L036LAB laminator from Siemens with a laminator temperature setting and pressure setting adapted to the encapsulation layer elements. The lamination settings are given in Table 3.

TABLE 3

Lamination settings for PV modules 1 to 5.

|  | Module 1 | Module 2 |
|---|---|---|
| Polymer composition for encapsulation layer element | IE1 | IE1 |
| Temperature, [° C.] | 150 | 150 |
| Pressure [mbar] | 800 | 800 |
| Total time of steps [s] | 1200[a] | 1200[a] |

[a]300 seconds melting stage and 900 second pressing stage.

A 1-cell photovoltaic module prepared according to the lamination process as described above is shown in FIG. 1 illustrating the layer elements (separated) of the photovoltaic module, namely a protective front layer element (1), a front encapsulation layer element (2), a photovoltaic cell element (3), a rear encapsulation layer element (4) and a protective back layer element (5).

D. Storage Stability Tests

D.1 Trial 1

The films samples as described above were cut out into three smaller pieces (300×50×0.45 mm) per outtake and placed in either a sealed aluminium bag, a sealed PE-bag or were stored without any packaging at all at 23° C. and 50% relative humidity. Both bags have been opened to atmosphere when transferring the polymer into it. The MFR2 (190° C. and 2.16 kg weight) of the samples was measured after different storage times and the results are summarized in below Tables 4 and in FIGS. 2 to 4 (showing the MFR2 vs. time). For CE1a to CE4a and IE1a samples made of the polymer compositions according to CE1 to CE4 and IE1 respectively, were used.

Figure 2:
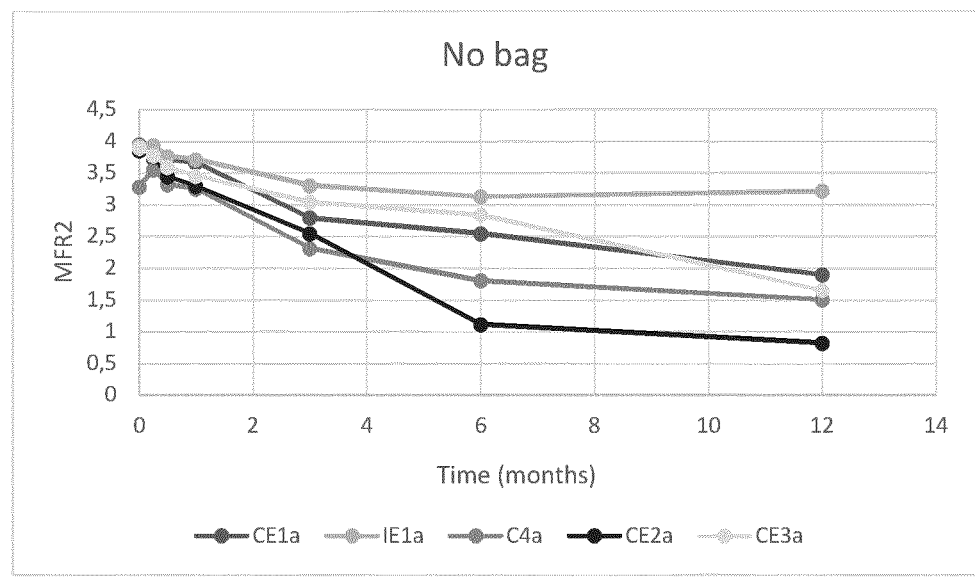
Figure 3:
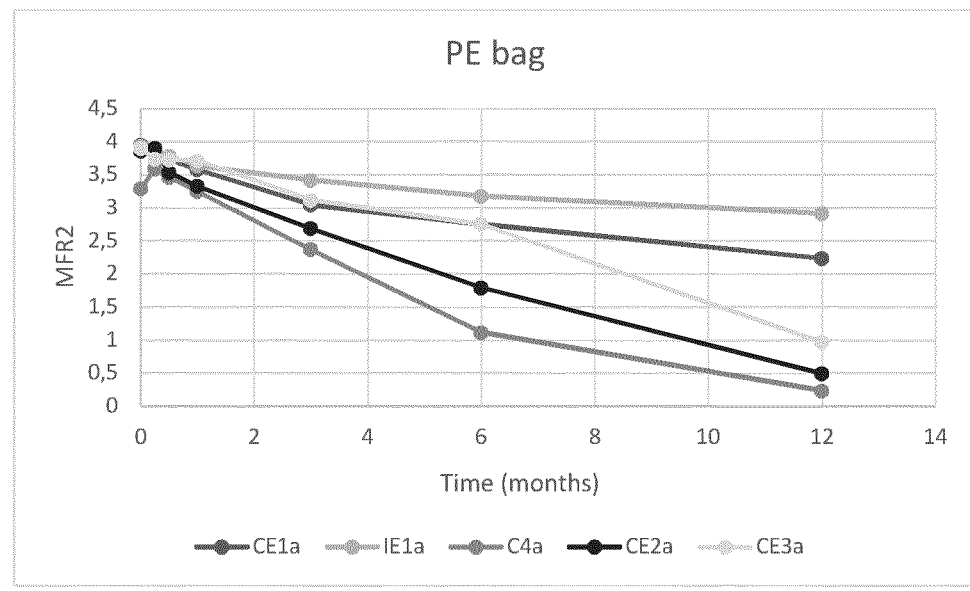
Figure 4:
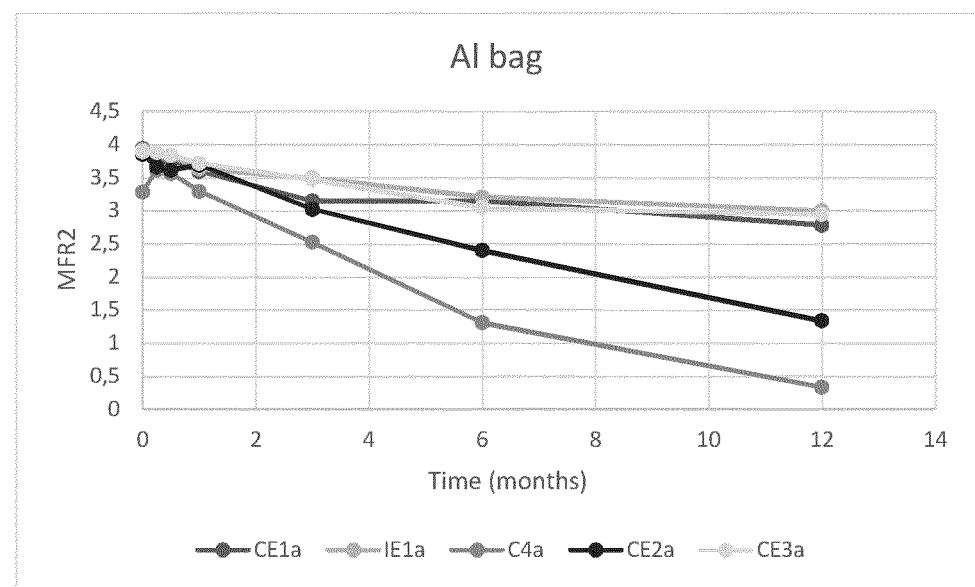

As can be seen from below Table 4 and FIGS. 2 to 4, no matter which sealing is used, the films made of the polymer composition CE4 show the worst storage stability. However, the combination of the stabilizer (=component (C)) used in CE4 in combination with Polymer A (=component (B)), shows superior results and the film made of polymer composition show the best storage stability. The experimental results clearly demonstrate that only the specific combination of technical features according to claim 1 allows to obtain polymer compositions showing excellent storage stability.

TABLE 4

Results of the storage tests.

| Time [months] | Unit | CE1a | CE2a | CE3a | CE4a | IE1a |
|---|---|---|---|---|---|---|
| No bag | | | | | | |
| 0 | g/10 min | 3.94 | 3.85 | 3.89 | 3.28 | 3.92 |
| 0.25 | g/10 min | 3.72 | 3.76 | 3.77 | 3.55 | 3.93 |
| 0.5 | g/10 min | 3.71 | 3.44 | 3.59 | 3.32 | 3.76 |
| 1 | g/10 min | 3.66 | 3.29 | 3.45 | 3.25 | 3.71 |
| 3 | g/10 min | 2.79 | 2.54 | 3.04 | 2.31 | 3.30 |
| 6 | g/10 min | 2.54 | 1.11 | 2.84 | 1.80 | 3.13 |
| 12 | g/10 min | 1.89 | 0.82 | 1.65 | 1.5 | 3.21 |
| % of the initial MFR$_2$ | | 48 | 21 | 42 | 46 | 82 |
| PE-bag | | | | | | |
| 0 | g/10 min | 3.94 | 3.85 | 3.89 | 3.28 | 3.92 |
| 0.25 | g/10 min | 3.84 | 3.89 | 3.73 | 3.58 | 3.86 |
| 0.5 | g/10 min | 3.72 | 3.53 | 3.72 | 3.46 | 3.78 |
| 1 | g/10 min | 3.57 | 3.32 | 3.71 | 3.24 | 3.63 |
| 3 | g/10 min | 3.04 | 2.68 | 3.11 | 2.36 | 3.41 |
| 6 | g/10 min | 2.75 | 1.79 | 2.75 | 1.11 | 3.17 |
| 12 | g/10 min | 2.23 | 0.49 | 0.97 | 0.23 | 2.91 |
| % of the initial MFR$_2$ | | 56 | 13 | 25 | 7 | 74 |
| Al-bag | | | | | | |
| 0 | g/10 min | 3.94 | 3.85 | 3.89 | 3.28 | 3.92 |
| 0.25 | g/10 min | 3.70 | 3.66 | 3.88 | 3.61 | 3.88 |
| 0.5 | g/10 min | 3.76 | 3.61 | 3.84 | 3.56 | 3.82 |
| 1 | g/10 min | 3.59 | 3.69 | 3.71 | 3.29 | 3.63 |
| 3 | g/10 min | 3.14 | 3.02 | 3.47 | 2.52 | 3.49 |
| 6 | g/10 min | 3.15 | 2.40 | 3.05 | 1.31 | 3.20 |
| 12 | g/10 min | 2.78 | 1.33 | 2.94 | 0.33 | 3 |
| % of the initial MFR$_2$ | | 71 | 35 | 76 | 10 | 77 |

D.2 Trial 2
Test Method
Storage Stability Measurements—Version 2

The film samples as described above were cut out into three smaller pieces (300×50×0.45 mm) per outtake and placed in a sealed aluminum bag. The samples were stored in an air-circulated oven at 40° C. The MFR$_2$ (190° C. and 2.16 kg weight) of the samples was measured after 3 days and 7 days. The storage stability test started six weeks after film extrusion. This is the reason why the starting MFR values differ. For examples IE2a to IE5a, samples made of the polymer compositions according to IE2 to IE5 were used.

Results

Studying the results in Table 5 below it can be seen that the MFR$_2$ value drops over time during storage when the concentration of Nucrel 0903 is increased from 0.25 wt % (IE2a) to 1.25 (IE3a). When the Polymer A content is increased from 0.5 wt. % (IE2a and IE3a) to 1.5 wt. % (IE4a and IE5a), the MFR$_2$ value drops significantly slower over time.

TABLE 5

Results of the storage tests.

| | Unit | IE2a | IE3a | IE4a | IE5a |
|---|---|---|---|---|---|
| MFR$_2$ (start) | g/10 min | 2.74 | 1.53 | 3.12 | 2.03 |
| MFR$_2$ (3 days) | g/10 min | 2.56 | 1.45 | 3.04 | 1.71 |
| MFR$_2$ (7 days) | g/10 min | 1.93 | 0.85 | 2.79 | 1.68 |

E. PID Testing

From Table 6, it can be concluded that the photovoltaic modules including a front and rear encapsulation layer element made of the polymer composition according to the present invention show only minor losses of Pmax after the PID test. Further, the conclusion is valid both for the power retention on the front and the rear side of the bifacial module.

TABLE 6

Retained power P$_{max}$ for PV modules 1 and 2.

| | Module 1 | Module 2 |
|---|---|---|
| Polymer composition for encapsulation layer element | IE1 | IE1 |
| Retained P$_{max}$ 96 h (front side) [%][a] | 99.10 | 99.68 |
| Retained P$_{max}$ 96 h (back side) [%][a] | 98.35 | 99.95 |

[a]average of 3 measurements.

The invention claimed is:

1. A polymer composition (I) comprising at least the following components:
    (A) 87.00 to 99.79 wt. % based on the overall weight of the polymer composition (I) of a polymer selected from an ethylene-vinylacetate copolymer, a polyolefin elastomer or a polymer of ethylene (a), wherein the polymer of ethylene (a) is selected from
    (a1) a copolymer of ethylene which bears functional groups containing units;
    (a2) a copolymer of ethylene comprising one or more polar comonomer unit(s) selected from (C1-C6)-alkyl acrylate or (C1-C6)-alkyl (C1-C6)-alkyl acrylate comonomer units, and bears functional groups containing units different from said polar comonomer unit(s); and
    (a3) a copolymer of ethylene comprising one or more alpha-olefin comonomer unit(s); and bears functional groups containing units different from said polar comonomer unit(s) of polymer (a2); or mixtures thereof; and
    wherein said functional groups containing units of polymer (a) are silane group(s) containing units (b);
    (B) 0.20 to 10.00 wt. % based on the overall weight of the polymer composition (I) of a copolymer of ethylene, which bears functional group containing units originating from at least one unsaturated carboxylic acid and/or its anhydrides, metal salts, esters, amides or imides and mixtures thereof, whereby component (B) is different from component (A);
    (C) 0.01 to 3.00 wt. % based on the overall weight of the polymer composition (I) of a compound according to Formula (a);

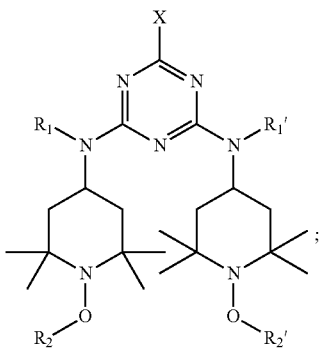

and
  optionally the following component (B2) and/or component (D):
  (B2) a copolymer of ethylene and (meth)acrylic acid, whereby component (B2), if present, is different from components (A) and (B);
  (D) at least one additive selected from the group consisting of antioxidants, UV light stabilizers, metal deactivators, nucleating agents, clarifiers, optical brighteners, acid scavengers, slip agents, pigments, fillers and flame retardants, tackifiers, plasticisers, crosslinking agents, crosslinking boosters, wavelength-shifting agents and mixtures thereof,
  whereby components (A), (B) and (C), and if present, component (B2) and/or component (D), add up to 100 wt. %.

2. The polymer composition (I) according to claim 1, wherein component (A) comprises:
  (a1) a copolymer of ethylene which bears silane group(s) containing units (b) as functional groups containing units; or
  (a2) a copolymer of ethylene comprising one or more polar comonomer unit(s) selected from (C1-C6)-alkyl acrylate or (C1-C6)-alkyl (C1-C6)-alkyl acrylate comonomer units, and bears silane group(s) containing units (b) as functional groups containing units different from said polar comonomer unit(s).

3. The polymer composition (I) according to claim 1, wherein;
  component (B) is a copolymer of ethylene and a C4 to C10 alpha olefin comonomer; whereby said copolymer before introducing the functional group has;
  (i) a density in the range of 850 kg/m³ to 920 kg/m³;
  (ii) an MFR2 in the range of 0.1 to 20.0 g/10 min, and
  (iii) 0.5 to 10 g/10 min measured according to ISO 1133 at 190° C. and a load of 2.16 kg.

4. The polymer composition (I) according to claim 1, wherein,
  component (B) bears functional group containing units originating from a compound selected from the group consisting of maleic anhydride, acrylic acid, methacrylic acid, crotonic acid, fumaric acid, fumaric acid anhydride, maleic acid, citraconic acid and mixtures thereof; and/or
  component (B) is obtained by copolymerising and/or grafting a copolymer of ethylene with a compound selected from the group consisting of maleic anhydride, acrylic acid, methacrylic acid, crotonic acid and mixtures thereof, and/or the content of the functional group containing units originating from unsaturated carboxylic acids or carboxyl acid anhydrides in component (B) is in the range of 0.01 to 2.0 wt. %.

5. The polymer composition (I) according to claim 1, wherein,
  component (C) is a compound represented by Formula (a); wherein;
    R1 and R1' are each independently n-alkyl groups; and/or
    R2 and R2' are each independently n-alkyl or cycloalkyl groups; and/or
    X is selected from the group consisting of secondary and tertiary amines.

6. The polymer composition (I) according to claim 1, wherein,
  component (C) has a molecular weight in the range of 1000 g/mol to 2800 g/mol; and/or
  component (C) is a compound having the following Formula (b):

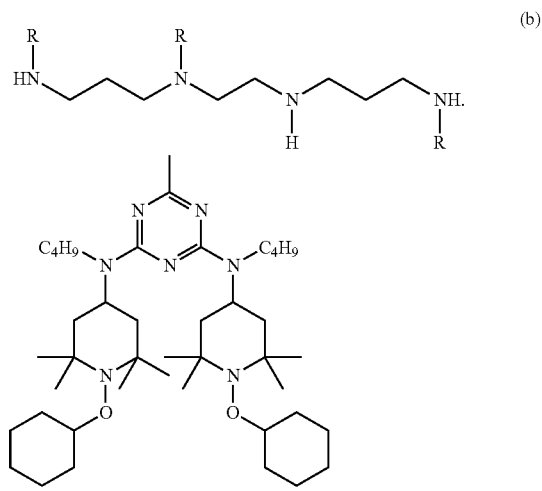

7. The polymer composition (I) according to claim 1, wherein,
  the polymer composition (I) comprises the component (B2) in an amount in the range of 0.05 to 5 wt. % based on the overall weight of the polymer composition (I).

8. The polymer composition (I) according to claim 1, wherein,
  the polymer composition (I) comprises the least one additive (D).

9. The polymer composition (I) according to claim 1, wherein,
  the content of component (A) in polymer composition (I) is in the range of 92.5 to 99.45 wt. % based on the overall weight of the polymer composition (I); and/or
  the content of component (B) in polymer composition (I) is in the range of 0.50 to 5.00 wt. % based on the overall weight of the polymer composition (I);
  the content of component (C) in polymer composition (I) is in the range of 0.05 to 2.50 wt. % based on the overall weight of the polymer composition (I).

10. A photovoltaic module comprising at least one layer comprising polymer composition (I) according to claim 1.

11. The photovoltaic module according to claim 10, wherein,
the photovoltaic module comprises a front encapsulant layer element and rear encapsulant layer element, whereby at least one of these encapsulant layer elements comprise polymer composition (I), and/or
polymer composition (I) is not cross-linked in the presence of a peroxide or a silanol condensation catalyst selected from carboxylates of tin, zinc, iron, lead or cobalt or aromatic organic sulphonic acids and/or
the protective front layer element is a rigid protective front layer element; and/or
the protective back layer element is a rigid protective back layer element.

12. The photovoltaic module according to claim 10, wherein, the retained Pmax determined according to IEC 60904 of the photovoltaic module is above 95%.

13. A method for improving the storage stability and/or transport stability of a polymer (A) comprising the following steps:
a) providing polymer (A) selected from an ethylene-vinylacetate copolymer, a polyolefin elastomer or a polymer of ethylene (a), whereby the polymer of ethylene (a) is selected from;
(a1) a copolymer of ethylene which bears functional groups containing units;
(a2) a copolymer of ethylene comprising one or more polar comonomer unit(s) selected from (C1-C6)-alkyl acrylate or (C1-C6)-alkyl (C1-C6)-alkyl acrylate comonomer units, and bears functional groups containing units different from said polar comonomer unit(s);
(a3) a copolymer of ethylene comprising one or more alpha-olefin comonomer unit(s); and bears functional groups containing units different from said polar comonomer unit(s) of polymer (a2); or mixtures thereof; and
wherein said functional groups containing units of polymer (a) are silane group(s) containing units (b);
b) providing a copolymer of ethylene (B), which bears functional group containing units originating from at least one unsaturated carboxylic acid and/or its anhydrides, metal salts, esters, amides or imides and mixtures thereof, whereby component (B) is different from component (A);
c) providing a compound according to Formula (a);

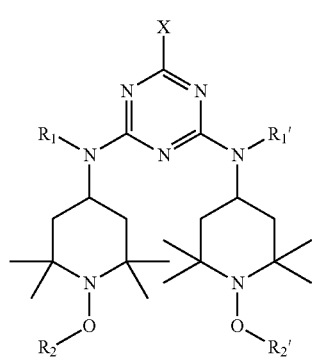

d) mixing polymer (A) and compounds (B) and (C) to obtain a stabilized polymer composition (I).

14. The method according to claim 13, wherein, component (A) comprises:
(a1) a copolymer of ethylene which bears silane group(s) containing units (b) as functional groups containing units; or
(a2) a polymer of ethylene comprising methyl acrylate comonomer units and bears silane group(s) containing units (b) as functional groups containing units different from said polar comonomer unit(s); and/or;
component (B) is a copolymer of ethylene and a C4 to C10 alpha olefin comonomer; whereby said copolymer before introducing the functional group has
(i) a density in the range of 850 kg/m3 to 920 kg/m3 measured according to ISO 1183; and/or
(ii) an MFR2 in the range of 0.1 to 20.0 g/10 min measured according to ISO 1133 at 190° C. and a load of 2.16 kg; and/or
component (C) is a compound having the following Formula (b):

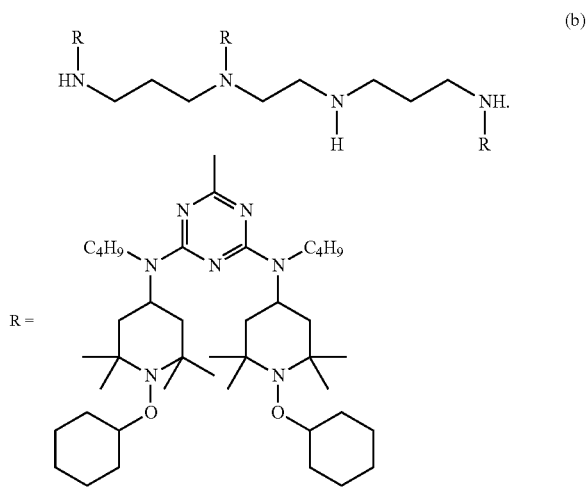

15. The polymer composition (I) according to claim 1, wherein component (A) consists of:
(a1) a copolymer of ethylene which bears silane group(s) containing units (b) as functional groups containing units; or
(a2) a copolymer of ethylene comprising one or more polar comonomer unit(s) selected from (C1-C6)-alkyl acrylate or (C1-C6)-alkyl (C1-C6)-alkyl acrylate comonomer units, and bears silane group(s) containing units (b) as functional groups containing units different from said polar comonomer unit(s).

16. The polymer composition (I) according to claim 1, wherein component (A) is:
(a1) a copolymer of ethylene which bears silane group(s) containing units (b) as functional groups containing units; or
(a2) a polymer of ethylene comprising methyl acrylate comonomer units and bears silane group(s) containing units (b) as functional groups containing units different from said polar comonomer unit(s).

17. The polymer composition (I) according to claim 16; wherein component (A) is a copolymer of ethylene (a1) with vinyl trimethoxysilane comonomer units or a terpolymer of ethylene (a2) with methyl acrylate comonomer units and vinyl trimethoxysilane comonomer units.

18. The polymer composition (I) according to claim 1, wherein component (B) is a copolymer of ethylene and 1-octene, which bears functional group containing units originating from at least one unsaturated carboxylic acid and/or its anhydrides, metal salts, esters, amides or imides and mixtures thereof, whereby component (B) is different from component (A).

\* \* \* \* \*